(12) United States Patent
Kim et al.

(10) Patent No.: US 9,620,524 B2
(45) Date of Patent: Apr. 11, 2017

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/407,514

(22) PCT Filed: May 30, 2014

(86) PCT No.: PCT/CN2014/078974
§ 371 (c)(1),
(2) Date: Dec. 12, 2014

(87) PCT Pub. No.: WO2015/096396
PCT Pub. Date: Jul. 2, 2015

(65) Prior Publication Data
US 2015/0294993 A1 Oct. 15, 2015

(30) Foreign Application Priority Data

Dec. 26, 2013 (CN) .......................... 2013 1 0740170

(51) Int. Cl.
*H01L 27/12* (2006.01)
*G02F 1/1333* (2006.01)
(Continued)

(52) U.S. Cl.
CPC ........ *H01L 27/1225* (2013.01); *G02F 1/1368* (2013.01); *G02F 1/13439* (2013.01);
(Continued)

(58) Field of Classification Search
CPC ................ H01L 27/1214; H01L 27/12; H01L 29/66757; H01L 27/3272; H01L 27/1225;
(Continued)

(56) References Cited

U.S. PATENT DOCUMENTS

2005/0275038 A1* 12/2005 Shih .................. H01L 29/78633
257/382
2009/0206332 A1 8/2009 Son et al.
(Continued)

FOREIGN PATENT DOCUMENTS

CN 103018989 A 4/2013
CN 103354244 A 10/2013
(Continued)

OTHER PUBLICATIONS

International Search Report, International Preliminary Report on Patentability and Written Opinion of the International Searching Authority of PCT/CN2014/078974 in Chinese, mailed Sep. 1, 2014.
(Continued)

*Primary Examiner* — John P Dulka
*Assistant Examiner* — Charles R Peters
(74) *Attorney, Agent, or Firm* — Collard & Roe, P.C.

(57) ABSTRACT

An array substrate and a manufacturing method thereof as well as a display device are disclosed. The array substrate includes a gate (21) and a gate insulating layers (22) of TFT formed in this order on a surface of a base substrate (20); a semiconductor active layer (23), an etching stop layer (24), and a source (251)/drain (252) of the TFT formed in this order on a surface of the gate insulating layer (22) corresponding to the gate (21) of the TFT. The source (251) and drain (252) of the TFT contact the semiconductor active layer (23) through respective vias. The array substrate further includes: a shielding electrode (26) formed between the gate (21) of the TFT and the base substrate (20); and an
(Continued)

E-E insulating layer (27) formed between the gate (21) of the TFT and the shielding electrode (26). In a region where the gate (21) faces the source (251), the area of the gate (210) is smaller than that of the source (251); and/or in a region where the gate (21) faces the drain (252), the area of the gate (210) is smaller than that of the drain (252). The array substrate according to embodiments of the present invention reduces the parasitic capacitance between the source/drain and the gate of the TFT and improves the quality of a display device.

20 Claims, 6 Drawing Sheets (51) Int. Cl.
| | |
|---|---|
| G02F 1/1343 | (2006.01) |
| G02F 1/1362 | (2006.01) |
| G02F 1/1368 | (2006.01) |
| H01L 29/417 | (2006.01) |
| H01L 29/423 | (2006.01) |
| H01L 29/45 | (2006.01) |
| H01L 29/66 | (2006.01) |
| H01L 29/786 | (2006.01) |
| G02F 1/136 | (2006.01) |

(52) U.S. Cl.
CPC .. *G02F 1/133345* (2013.01); *G02F 1/136277* (2013.01); *H01L 27/1259* (2013.01); *H01L 29/41733* (2013.01); *H01L 29/41758* (2013.01); *H01L 29/42356* (2013.01); *H01L 29/45* (2013.01); *H01L 29/66969* (2013.01); *H01L 29/7869* (2013.01); *H01L 29/78633* (2013.01); *G02F 2001/13606* (2013.01); *G02F 2001/134372* (2013.01); *G02F 2001/136218* (2013.01)

(58) Field of Classification Search
CPC ........... H01L 29/66969; H01L 29/7869; H01L 29/42356; H01L 29/41733; H01L 29/78633; H01L 29/41758; H01L 29/45; H01L 27/1259; G02F 1/13439; G02F 1/1368; G02F 1/136277; G02F 1/133345
See application file for complete search history.

(56) References Cited

U.S. PATENT DOCUMENTS

| | | | | |
|---|---|---|---|---|
| 2014/0151708 | A1* | 6/2014 | Jeon et al. | 257/72 |
| 2015/0008434 | A1* | 1/2015 | Yang et al. | 257/59 |
| 2015/0187948 | A1* | 7/2015 | Misaki | 257/43 |

FOREIGN PATENT DOCUMENTS

| | | |
|---|---|---|
| CN | 103728803 A | 4/2014 |
| CN | 203720505 U | 7/2014 |

OTHER PUBLICATIONS

Written Opinion of the International Searching Authority of PCT/CN2014/078974 with English Translation, mailed Aug. 29, 2014.
English translation of the International Preliminary Report on Patentability and Written Opinion of the International Searching Authority of PCT/CN2014/078974, issued Jun. 28, 2016.

* cited by examiner

ARRAY SUBSTRATE AND MANUFACTURING METHOD THEREOF, DISPLAY DEVICE

CROSS REFERENCE TO RELATED APPLICATIONS

This application is the National Stage of PCT/CN2014/078974 filed on May 30, 2014, which claims priority under 35 U.S.C. §119 of Chinese Application No. 201310740170.9 filed on Dec. 26, 2013, the disclosure of which is incorporated by reference.

TECHNICAL FIELD

The present disclosure relates to an array substrate and a manufacturing method thereof, and a display device.

BACKGROUND

With the progressive development of TFT-LCD (Thin Film Transistor, Liquid Crystal Display) display technology, various novel semiconductor elements and their application technologies in display devices have made rapid progress.

Figure 1:
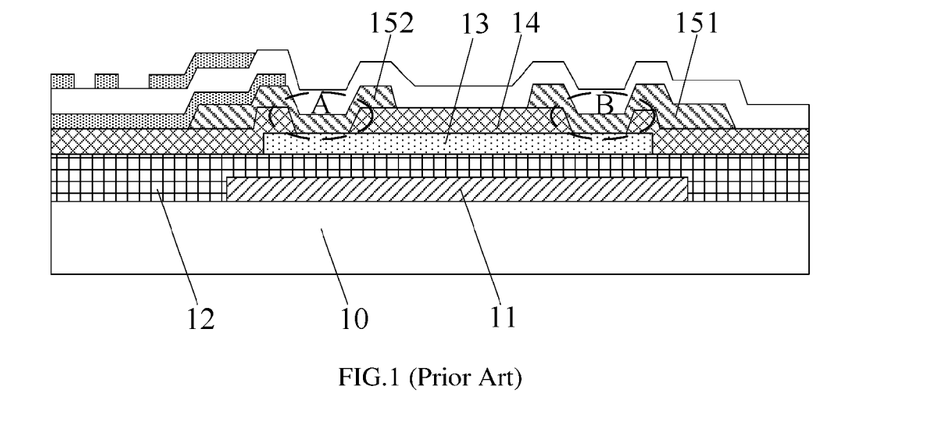
FIG. 1 is a schematically structural diagram of a known array substrate.

In a known manufacturing process of TFT-LCDs, more and more manufacturers began to use oxide TFT instead of a-Si (amorphous silicon) TFT or LTPS (low temperature polysilicon) TFT in the hope of obtaining display products with higher quality. Unlike the traditional a-Si TFT where the semiconductor active layer is made of an oxide semiconductor material, the Oxide TFT backboard technology replaces the silicon semiconductor material with an oxide semiconductor material, such as IGZO (Indium Gallium Zinc Oxide) commonly used at present. A known oxide TFT array substrate is typically as illustrated in FIG. 1, which comprises a gate 11, a gate insulating layer 12 and a semiconductor active layer 13 formed of IGZO, the three layers are formed on a base substrate 10 in this order. An etching stop layer 14 with vias A and B is formed on a surface of the semiconductor active layer 13 with a patterning process. The vias A and B penetrate the etching stop layer 14 respectively to expose the semiconductor active layer 13. A source 151 and a drain 152 of a TFT are electrically connected with the semiconductor active layer 13 through the vias A and B, respectively.

SUMMARY

The present disclosure provides an array substrate and a manufacturing method thereof, and a display device comprising the array substrate.

According to one embodiment of the present invention, there is provided an array substrate comprising: a gate and a gate insulating layer of a TFT formed on a surface of a base substrate in this order; a semiconductor active layer, an etching stop layer, a source and a drain of the TFT sequentially formed on a surface of the gate insulating layers that corresponds to the gate of the TFT, the source and the drain of the TFT contacting the semiconductor active layers through vias respectively; the array substrate further comprising: a shielding electrode formed between the gate of the TFT and the base substrate; and an insulating layer formed between the gate of the TFT and the shielding electrode. In a region where the gate faces the source, an area of the gate is smaller than that of the source; and/or in a region where the gate faces the drain, an area of the gate is smaller than that of the drain.

According to another embodiment of the present invention, there is further provided a display device comprising the array substrate as mentioned above.

According to yet another embodiment of the present invention, there is further provided a method of manufacturing an array substrate, comprising:

forming a shielding electrode on a surface of a base substrate;

forming an insulating layer on the surface of the substrate having the shielding electrode formed thereon;

forming a gate of TFT on a surface of the insulating layer at a location corresponding to the shielding electrode, wherein in a region where the gate faces the source, an area of the gate is smaller than that of the source; and/or in a region where the gate faces the drain, an area of the gate is smaller than that of the drain.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make the purpose, technical proposal and advantages of embodiments of the present invention more clear, the technical proposal in embodiments of the present invention will be described clearly and fully below with reference to accompanying drawings in embodiments of the present invention. It is understood that the described embodiments are merely a part of embodiments rather than all embodiments of the present invention. Based on embodiments in the present invention, all other embodiments obtained by those skilled in the art without creative labor will fall into the protection scope of the present invention.

In the known oxide TFT array substrate of FIG. 1, each of the source 151 and drain 152 of the TFT has a large overlapping area with the gate 11. In case that the TFT is energized, a parasitic capacitance Cgs is generated between the source 151 and the gate 11, and similarly a parasitic capacitance Cgd is generated between the drain 152 and the gate 11. The gate 11 controls TFT's on/off by a voltage. While the TFT is turned off, high to low change of the voltage on the gate 11 would cause the drain 152 to output a step voltage due to the presence of parasitic capacitance Cgs and Cgd, and would result in a sudden decrease on the voltage of the liquid crystals in the pixel, thus, it may have a strong impact on the accuracy of the pixel electrode voltage and lead to blinking of the displayed images.

Figure 2:
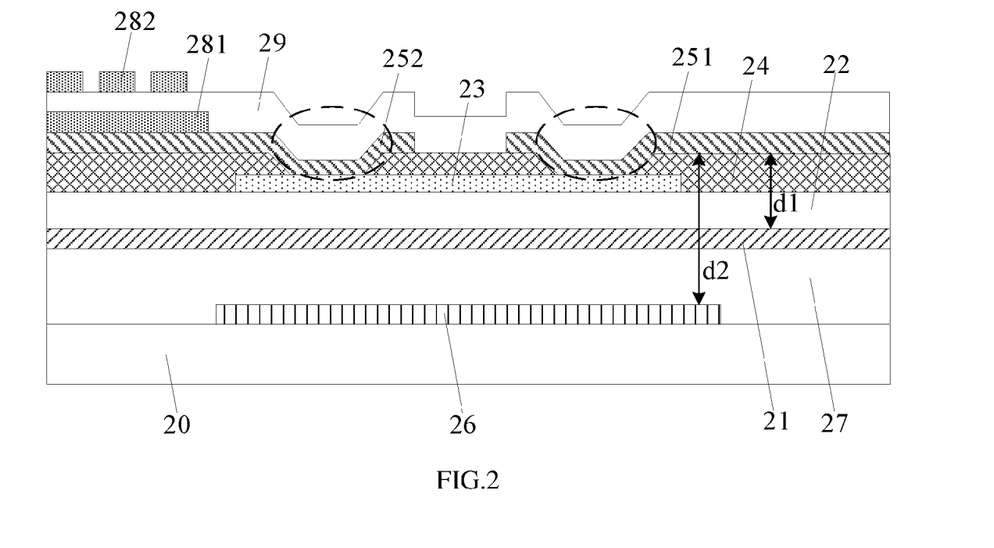
FIG. 2 is a schematically structural diagram of an array substrate provided in an embodiment of the present invention.

As illustrated in FIG. 2, an array substrate provided in an embodiment of the present invention comprises:

a gate 21 and a gate insulating layer 22 of a TFT formed on a surface of a base substrate 20 in this order;

a semiconductor active layer 23, an etching stop layer 24 and a source 251 and a drain 252 of the TFT sequentially formed on a surface of the gate insulating layer 22 in this order corresponding to the gate 21 of the TFT, wherein the source 251 and drain 252 of the TFT contacts the semiconductor active layer 23 through respective two vias (illustrated by dashed line in FIG. 2).

Expression "A corresponds to B" as used in the present disclosure means that A and B are opposite to or substantially overlap each other in the vertical direction. Therefore, "the surface of the gate insulating layers 22 corresponding to the gate 21 of the TFT" should be understood as the surface of the part of the gate insulating layer 22 that is opposite to or overlap the gate 21 in the vertical direction.

The array substrate further comprises:

a shielding electrode 26 formed between the gate 21 of TFT and the base substrate 20; and an insulating layer 27 formed between the gate 21 of TFT and the shielding electrode 26.

In one embodiment, the shielding electrode 26 is of electrically conductive material and formed on a surface of the base substrate 20 by one patterning process. The shielding electrode 26 can shield light from the backlight source to avoid light incident onto the channel (between the source 251 and drain 252) of TFT, and therefore can avoid C-V characteristic change of TFT caused by light illumination, hence effectively preventing element's cut-off current ($I_{OFF}$) from increasing.

In the embodiment, in the region where the gate 21 faces the source 251, the area of the gate (not illustrated in FIG. 2) is smaller than that of the source 251; and/or in the region where the gate 21 faces the drain 252, the area of the gate is smaller than that of the drain 252. In one embodiment, the length of the shielding electrode 26 in the horizontal direction is smaller than the length of the gate 21 (See FIG. 7).

Figure 9:
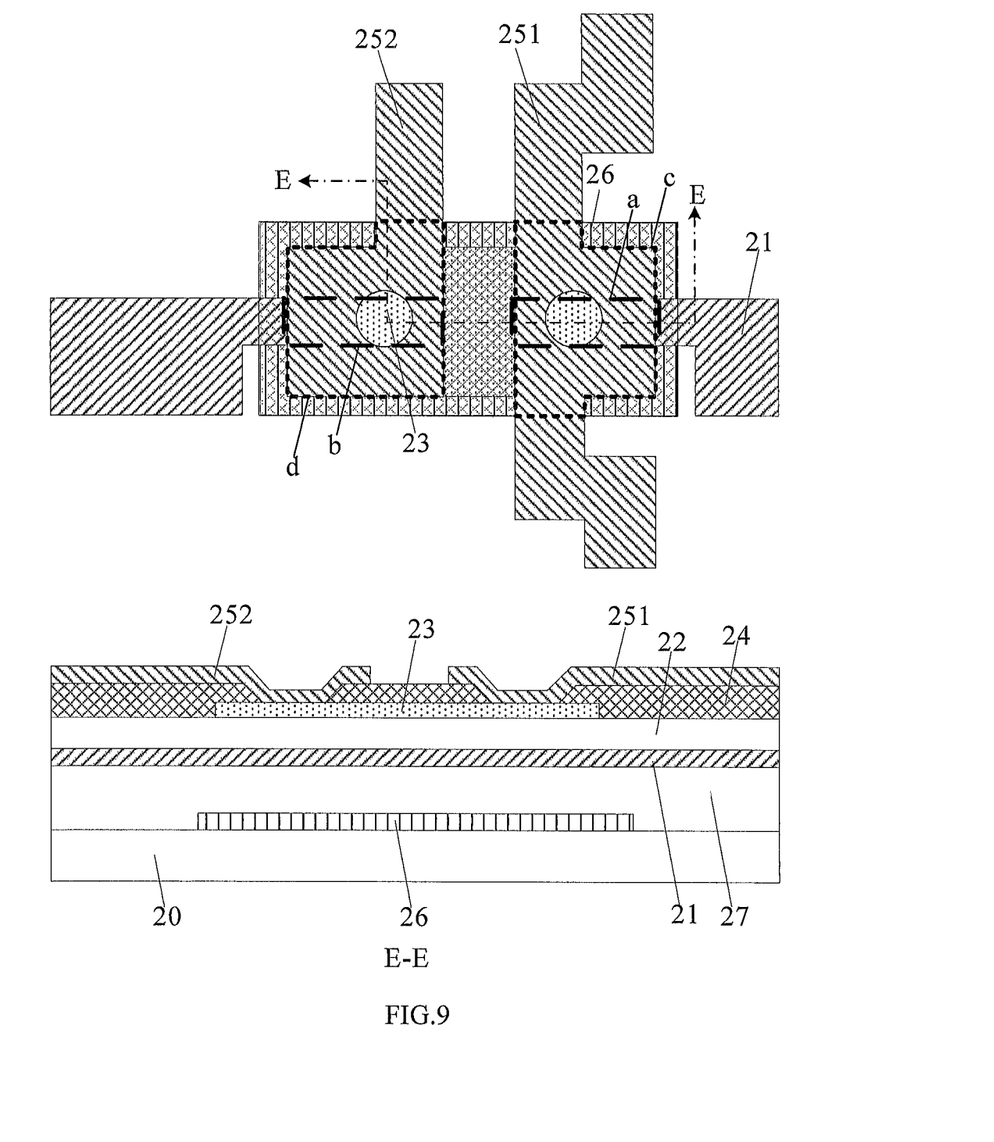
FIG. 9 is a partial top view and a sectional view in E-E direction of the substrate after forming the source and the drain of TFT according to an embodiment of the present invention.

As illustrated in FIGS. 2 and 9, an overlapping area between the gate 21 and the source 251 is defined as a, and an overlapping area between the gate 21 and the drain 252 is defined as b, then Cgs+Cgd=(a+b)/d1, where d1 is the vertical distance between the gate 21 and the source 251 or the drain 252. An overlapping area between the shielding electrode 26 and the source 251 is defined as c, an overlapping area between the shielding electrode 26 and the drain 252 is d, and a vertical distance between the shielding electrode 26 and the source 251 or the drain 252 is d2. Now, two capacitances are formed by the shielding electrode 26: on one hand, a capacitance C1 is generated between the gate 21 and a part of the shielding electrode 26 which overlaps the gate 21, the capacitance C1 is connected in series with Cgs+Cgd such that a total series capacitance Ct1 is less than Cgs+Cgd; on the other hand, a capacitance C2 is generated between the source 251 (as well as the drain 252) and the part of the shielding electrode 26 which does not overlap the gate 21, then C2=(c+d−a−b)/d2. Since capacitances Ct1 and C2 are connected in parallel and Ct1<Cgs+Cgd=(a+b)/d1 (d1<d2), thus, Ct1+C2<(a+b)/d1+(c+d−a−b)/d2<(c+d)/d1. Whereas in the known array substrates, Cgs+Cgd=(c+d)/d1. The above analysis further demonstrates that the array substrate of the present disclosure can reduce the parasitic capacitance.

It is to be noted that the region shielded by the shielding electrode 26 may vary according to practical situations. Without influencing the aperture ratio, the shielding electrode 26 shields as much as possible the region where the source 251 overlaps the gate 21 and/or the region where the drain 252 overlaps the gate 21. According to the formula for parallel plate capacitor C=εS/d, in order to reduce the capacitance C between the parallel electrodes, capacitance reduction is realized by reducing overlapping area between two electrodes with other conditions unchanged. In the above-mentioned embodiments, in order to reduce parasitic capacitances Cgs and Cgd, the capacitance formed between the shielding electrode and the gate of TFT is helpful to significantly reduce the capacitance formed between the source/drain of TFT and the gate. Furthermore, the reduced overlapping area between the gate and the source/drain of TFT can effectively minimize the step voltage's influence on displayed images generated by the parasitic capacitance.

In the above-mentioned embodiments, the case where the two portions of the gate 21 corresponding to the source 251 and the drain 252 respectively are smaller than those of the source 215 and the drain 252 has been described. It can be contemplated that the above-mentioned technical effect can also be realized while only one portion is smaller than the area of one of the source 215 and drain 252.

In such an array substrate provided in the above-mentioned embodiments, the shielding electrode is provided between the gate of TFT and the base substrate, and an insulating layer is provided between the gate of TFT and the shielding electrode, wherein in the region where the gate faces the source, the area of the gate is smaller than that of the source; and/or in the region where the gate faces the drain, the area of the gate is smaller than that of the drain. Due to the reduced overlapping area between two electrodes of a parallel plate capacitor, capacitance is reduced significantly, which can effectively reduce the parasitic capacitance Cgs generated between the source and the gate of TFT and/or reduce the parasitic capacitance Cgd generated between the drain and the gate of TFT. Furthermore, the capacitance formed between the shielding electrode and the gate of TFT can shield the capacitance formed between the source/drain and the gate of TFT in the same area to a great extent. Therefore, the array substrate of the present disclosure can avoid the step voltage output caused by too large parasitic capacitance, effectively reduce the blinking of displayed images and enhance the quality of display devices.

In at least one embodiment of the present invention, the insulating layer 27 is made of an organic resin material with good insulativity. In practical applications, the thickness of the insulating layer 27 may be selected according to practical requirements, which is not limited in the present invention.

It is to be noted that the TFT-LCD array substrate provided in the above embodiments may be applied to liquid crystal displays such as FFS (Fringe Field Switching) type, AD-SDS (ADvanced-Super Dimensional Switching, ADS for short) type, IPS (In Plane Switch) type, and TN (Twist Nematic) type.

Each of the above-mentioned liquid crystal display devices comprises a color filter substrate and an array substrate assembled to form a cell. However, in TN type display device, a common electrode is disposed on the color filter substrate and a pixel electrode is disposed on the array substrate; while in FFS type display device, ADS type display device and IPS type display device, both common electrode and pixel electrode are disposed on the array substrate.

An array substrate applied to FFS type display device will be described below as an example. As illustrated in FIG. 2, the array substrate according to the above-mentioned embodiment further comprises:

a first transparent electrode 281 formed on a surface of the etching stop layer 24, the first transparent electrode 281 contacts the drain 252 of the TFT;

a passivation layer 29 formed on a surface of the first transparent electrodes 281, the passivation layer 29 overlays the TFT; and a second transparent electrode 282 formed on a surface of the passivation layer 29.

Expression "overlay a TFT" as used herein means the regions where the gate, drain and source of the TFT are located are overlaid.

In one embodiment, the first transparent electrode 281 is a pixel electrode, the second transparent electrode 282 is a common electrode, and the first transparent electrode 281 is a plate-shaped electrode, and the second transparent electrode 282 is a strip-shaped electrode which comprises a plurality of metal strips spaced apart from one another.

Optionally, the electrode in upper layer is the strip-shaped electrode, and the electrode in lower layer is the strip-shaped electrode or plate-shaped electrode. In the above-mentioned embodiments, the electrode in lower layer is the plate-shaped electrode. In the array substrate for the FFS type display device, the common electrode and the pixel electrode are disposed in different layers. "Disposed in different layers" as used herein means that at least two patterns are formed of at least two layer films with respective patterning process. For example, the expression "the common electrode and the pixel electrode are disposed in different layers" means that a lower electrode is formed by patterning a first layer of transparent electrically conductive film, and an upper electrode is formed by patterning a second layer of transparent electrically conductive film. The lower electrode is the common electrode (or the pixel electrode), and the upper electrode is the pixel electrode (or the pixel electrode).

The array substrate with such a configuration provided in the present embodiment can be also applied in an IPS type display device. What is different from the FFS type display device is that, in an IPS type display device, the common electrode and the pixel electrode are disposed in same and one layer, and the common electrode comprises a plurality of first strip-shaped electrodes, the pixel electrode comprises a plurality of second strip-shaped electrodes, the first strip-shaped electrode and the second strip-shaped electrode are disposed alternately. The expression "disposed in same and one layer" herein means that at least two patterns are formed by patterning same and one film. For example, the expression "the common electrode and the pixel electrode are disposed in same and one layer" means that the common electrode and the pixel electrode are formed by patterning same and one transparent electrically conductive film. The pixel electrode refers to the electrode being electrically connected with a data line through a switching unit such as the TFT, while the common electrode refers to the electrode being electrically connected with a common electrode line.

In at least one embodiment of the present invention, the semiconductor active layer 23 is made of a transparent metal oxide material, which presents semiconductor characteristics. For example, the transparent metal oxide material comprises at least one of IGZO (indium gallium zinc oxide), IGO (indium gallium oxide), ITZO (indium tin zinc oxide) or AlZnO (aluminum zinc oxide). Using such a transparent metal oxide material instead of a-Si (amorphous silicon) or LTPS (low temperature polysilicon) to form the semiconductor active layers of TFT has advantages of low manufacturing temperature requirement and high mobility. This technology can be applied in both high frequency display and high resolution display products and has advantages of low device costs and low operation costs relative to LTPS TFT technology.

Another embodiment of the present invention further provides a display device comprising the array substrate as mentioned above.

In one embodiment, the array substrate comprises a shielding electrode formed between the gate of TFT and the base substrate, and an insulating layer formed between the gate of TFT and the shielding electrode; wherein in the region where the gate faces the source, the area of the gate is smaller than that of the source; and/or in the region where the gate faces the drain, the area of the gate is smaller than that of the drain.

The display device provided in the present embodiment may be any products or components with display functions, such as liquid crystal panels, electronic paper, OLED panels, liquid crystal TVs, liquid crystal displays, digital picture frames, cell phones and tablet computers.

In the display device comprising the array substrate provided in the above-mentioned embodiments, a shielding electrode is provided between the gate of TFT and the base substrate, and an insulating layer is provided between the gate of TFT and the shielding electrode, wherein in the region where the gate faces the source, the area of the gate is smaller than that of the source; and/or in the region where the gate faces the drain, the area of the gate is smaller than that of the drain. Due to the reduced overlapping area between two electrodes of a parallel plate capacitor, capacitance is reduced significantly, which can effectively reduce the parasitic capacitance Cgs generated between the source and the gate of TFT and/or reduce the parasitic capacitance Cgd generated between the drain and the gate of TFT. Furthermore, the capacitance formed between the shielding electrode and the gate of TFT can shield the capacitance formed between the source/drain and the gate of TFT in the same area to a great extent. Therefore, it is possible to avoid the step voltage output caused by too large parasitic capacitance, effectively reduce the blinking of displayed images and enhance the quality of display devices.

Yet another embodiment of the present invention further provides a method of manufacturing an array substrate, which comprises the following steps.

S301, a shielding electrode is formed on a surface of a base substrate.

For example, the shielding electrode of electrically conductive material is formed on a surface of the base substrate by using one patterning process.

S302, an insulating layer is formed on the surface of the substrate having the shielding electrode formed thereon.

In at least one embodiment of the present invention, the insulating layer 27 is made of an organic resin material with good insulativity. In practical applications, the thickness of the insulating layer 27 may be selected according to practical requirements, which is not limited in the present invention.

S303, the gate of TFT is formed on a surface of the insulating layer at location corresponding to the shielding electrode. In a region where the gate faces a source, the area of the gate is smaller than that of the source; and/or in a region where the gate faces a drain, the area of the gate is smaller than that of the drain.

In such a manufacturing method provided in the above-mentioned embodiment, the shielding electrode is provided between the gate of TFT and the base substrate, and an insulating layer is provided between the gate of TFT and the shielding electrode, wherein in the region where the gate faces the source, the area of the gate is smaller than that of the source; and/or in the region where the gate faces the drain, the area of the gate is smaller than that of the drain. Due to the reduced overlapping area between two electrodes of a parallel plate capacitor, capacitance is reduced significantly, which can effectively reduce the parasitic capacitance Cgs generated between the source and the gate of TFT and/or reduce the parasitic capacitance Cgd generated between the drain and the gate of TFT. Furthermore, the capacitance formed between the shielding electrode and the gate of TFT can shield the capacitance formed between the source/drain and the gate of TFT in the same area to a great extent. Therefore, the array substrate of the present disclosure can avoid the step voltage output caused by too large parasitic capacitance, effectively reduce the blinking of displayed images and enhance the quality of display devices.

It is to be noted that the region shielded by the shielding electrode 26 may vary according to practical situations. Without influencing the aperture ratio, the shielding electrode 26 shields as much as possible the region where the source 251 overlaps the gate 21 and/or the region where the drain 252 overlaps the gate 21. According to the formula for parallel plate capacitor $C=\epsilon S/d$, in order to reduce the capacitance C between the parallel electrodes, capacitance reduction is realized by reducing overlapping area between two electrodes with other conditions unchanged. In the above-mentioned embodiments, in order to reduce parasitic capacitances Cgs and Cgd, the capacitance formed between the shielding electrode and the gate of TFT is helpful to significantly reduce the capacitance formed between the source/drain of TFT and the gate. Furthermore, the reduced overlapping area between the gate and the source/drain of TFT can effectively minimize the step voltage's influence on displayed images generated by the parasitic capacitance.

Furthermore, yet another embodiment of the present invention provides a method of manufacturing an array substrate, which comprises the following steps.

S401, a shielding electrode is formed on a surface of a base substrate by a patterning process.

In the practical production process of the array substrate, the base substrate 20 is made of a transparent material with certain rigidity, such as glass or transparent resin. Then, the shielding electrode is formed on the base substrate by one patterning process.

Figure 3:
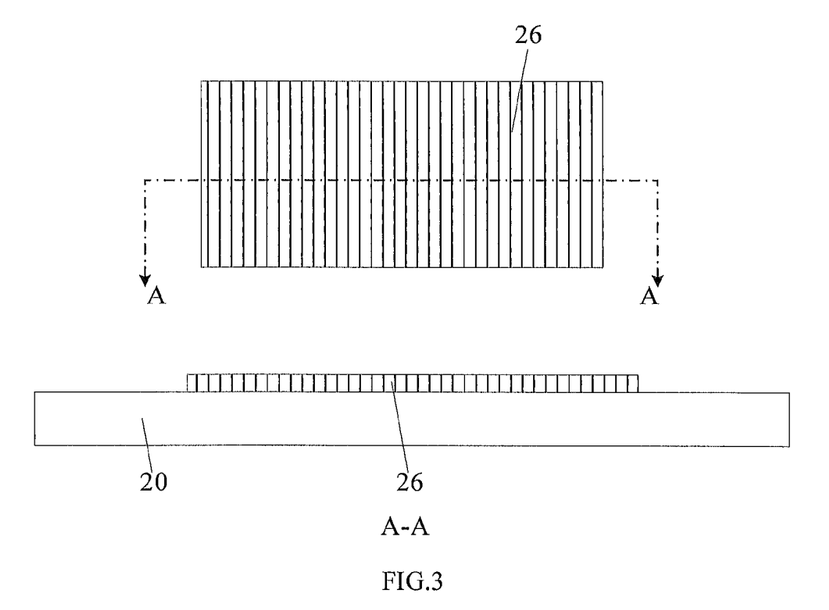
FIG. 3 is a partial top view and a sectional view in A-A direction of the substrate after forming the shielding electrode according to an embodiment of the present invention.

For example, a metal material of a certain thickness is deposited first on a surface of the base substrate 20, and then exposed and developed with a mask having specific pattern to form the shielding electrode 26 as illustrated in FIG. 3.

S402, an insulating layer is formed on the surface of the substrate having the shielding electrode formed thereon.

Figure 4:
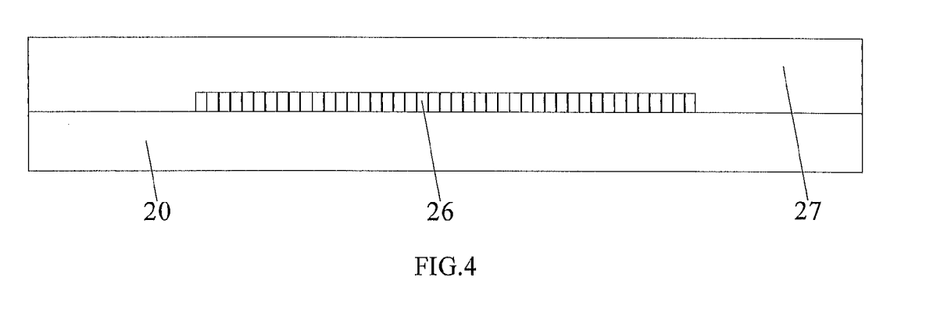
FIG. 4 is a schematically structural diagram of the substrate after forming the insulating layer according to an embodiment of the present invention.

For example, as illustrated in FIG. 4, a layer of organic resin material with a certain thickness is coated on the surface of the substrate having the shielding electrode 26 formed thereon to form the insulating layer 27. The insulating layer 27 completely covers the shielding electrode 26.

S403, the gate of TFT is formed on a surface of the insulating layer at location corresponding to the shielding electrode by a patterning process, wherein in the region where the gate faces the source, the area of the gate is smaller than that of the source; and/or in the region where the gate faces the drain, the area of the gate is smaller than that of the drain. For example, the numeral 210 in FIG. 5 denotes the area of the gate in the region where the gate faces the drain or the source.

Figure 5:
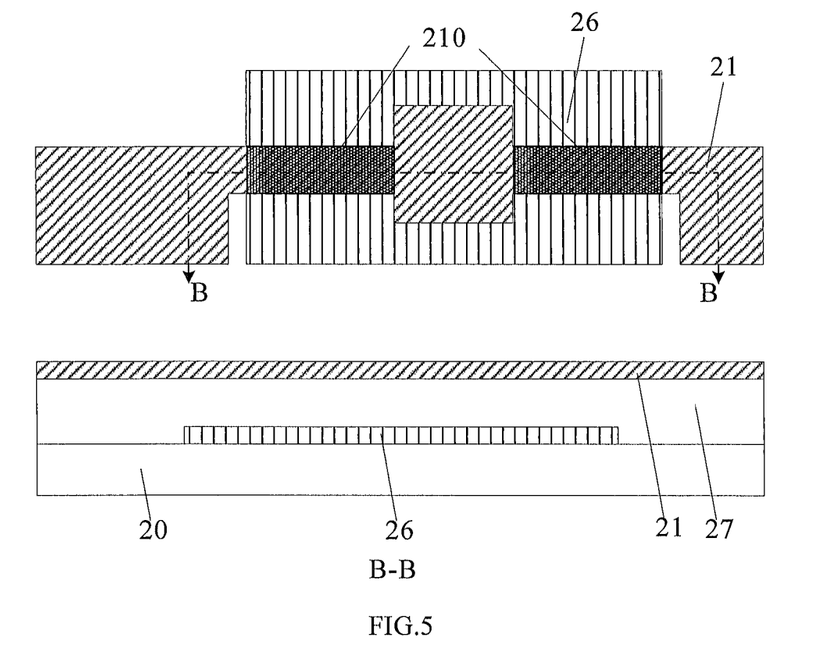
FIG. 5 is a partial top view and a sectional view in B-B direction of the substrate after forming the gate of TFT according to an embodiment of the present invention.

For example, the metal layer is formed on the substrate having the insulating layer 27 formed thereon by plasma enhanced chemical vapor deposition (PECVD), magnetron sputtering, thermal evaporation or other film formation methods. The metal layer may be a single-layer film formed of metals or alloy, such as molybdenum, aluminum, aluminum rubidium alloy, tungsten, chromium, copper, and may also be a multilayer film formed of a plurality of layers of the above metals or alloys. Photoresist is first formed on a surface of the metal layer, and then exposed and developed with a mask with specific pattern to expose a part of metal layer. Next, the part of metal layer is peeled off. Thus, a gate 21 of TFT as illustrated in the top view in FIG. 5 is formed on the surface of the insulating layer 27. It can be seen from the sectional view in B-B direction of FIG. 5, the length of the gate 21 of TFT is greater than that of the shielding electrode 26.

S404, a gate insulating layer is formed on the surface of the substrate having the gate of TFT formed thereon.

Figure 6:
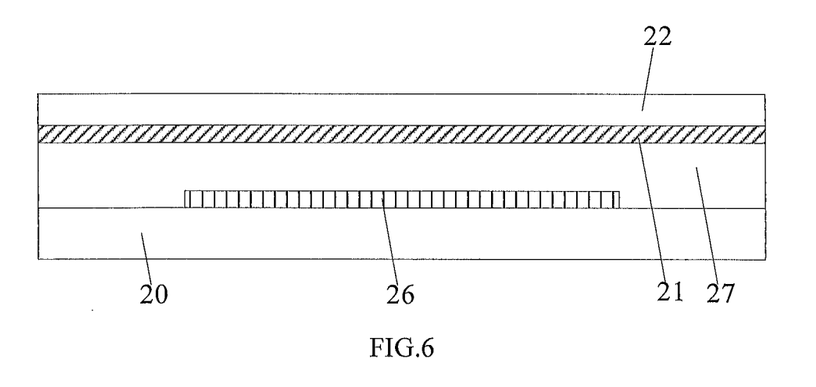
FIG. 6 is a schematically structural diagram of the substrate after forming the gate insulating layer according to an embodiment of the present invention.

As illustrated in FIG. 6, a gate insulating layer 22 with a uniform thickness is formed on the surface of the substrate having the gate 21 formed thereon.

S405, a semiconductor active layer is formed on a surface of the gate insulating layer that corresponds to the gate of TFT by a patterning process.

Figure 7:
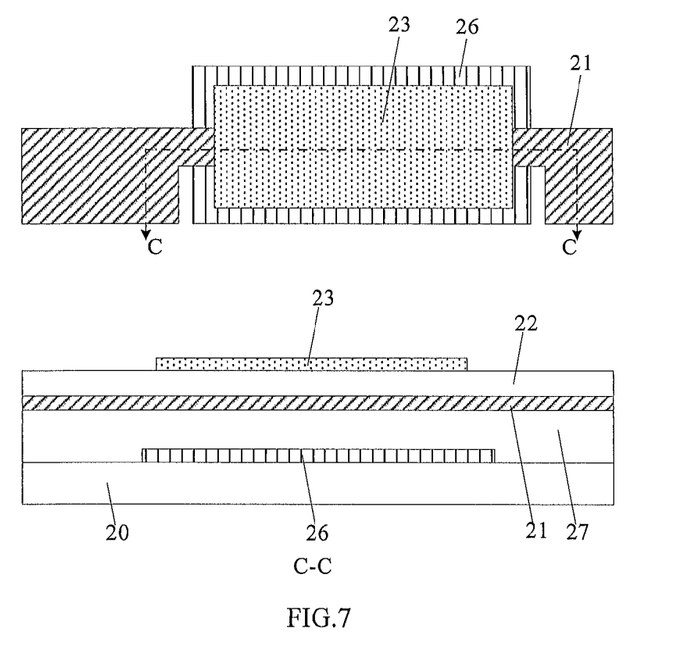
FIG. 7 is a partial top view and a sectional view in direction C-C of the substrate after forming the semiconductor active layer according to an embodiment of the present invention.

For example, a semiconductor active layer film with semiconductor characteristic is formed on the surface of the substrate obtained from the previous step, and then the semiconductor active layer 23 as illustrated in the top view in FIG. 7 is formed by mask exposure and development.

It is to be noted that in at least one embodiment of the present invention, the semiconductor active layer 23 is made of a transparent metal oxide material with semiconductor characteristics. For example, the transparent metal oxide material comprises at least one of IGZO, IGO, ITZO, or AlZnO. Using such a transparent metal oxide material instead of a-Si (amorphous silicon) or LTPS (low temperature polysilicon) to form the semiconductor active layers of TFT has advantages of low manufacturing temperature requirement and high mobility. This technology can be applied in both high frequency display and high resolution display products and has advantages of low device costs and low operation costs relative to LTPS TFT technology.

S406, an etching stop layer with vias is formed on a surface of the semiconductor active layer by a patterning process.

Figure 8:
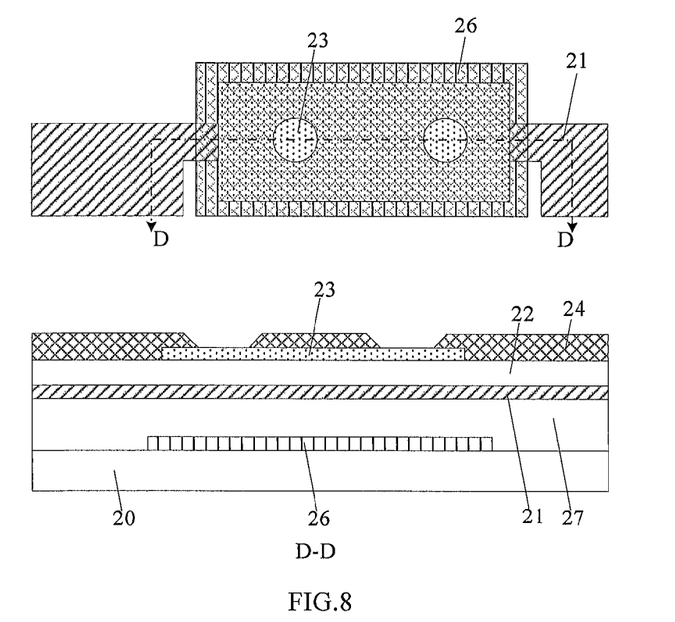
FIG. 8 is a partial top view and a sectional view in direction D-D of the substrate after forming the etching stop layer according to an embodiment of the present invention.

The etching stop layer 24 is illustrated in the sectional view in D-D direction of FIG. 8. For example, an etching stop layer film is coated or deposited on the substrate obtained from the previous step, and then exposed and developed with a mask having specific pattern to finally form two vias at locations corresponding to the source and drain of the TFT respectively through which the semiconductor active layer 23 is exposed.

S407, a source and a drain of the TFT are formed on a surface of the etching stop layer by a patterning process, the source and drain contact the semiconductor active layer through the vias respectively.

The configuration of the substrate having the source 251 and drain 252 of TFT formed thereon is illustrated in FIG. 9.

In a region where the gate 21 faces the source 251, the area of the gate is smaller than the area of the source 251; and/or in a region where the gate 21 faces the drain 252, the area of the gate is smaller than the area of the drain 252. The area of the gate is illustrated in FIG. 5. As can be seen clearly in FIG. 9, in a region where the gate 21 faces the source 251 or the drain 252, the area 210 of the gate is smaller than the area of the source 251 or the drain 252.

S408, a first transparent electrode is formed on a surface of the etching stop layers by a patterning process, the first transparent electrode contacts the drain of the TFT.

Figure 10:
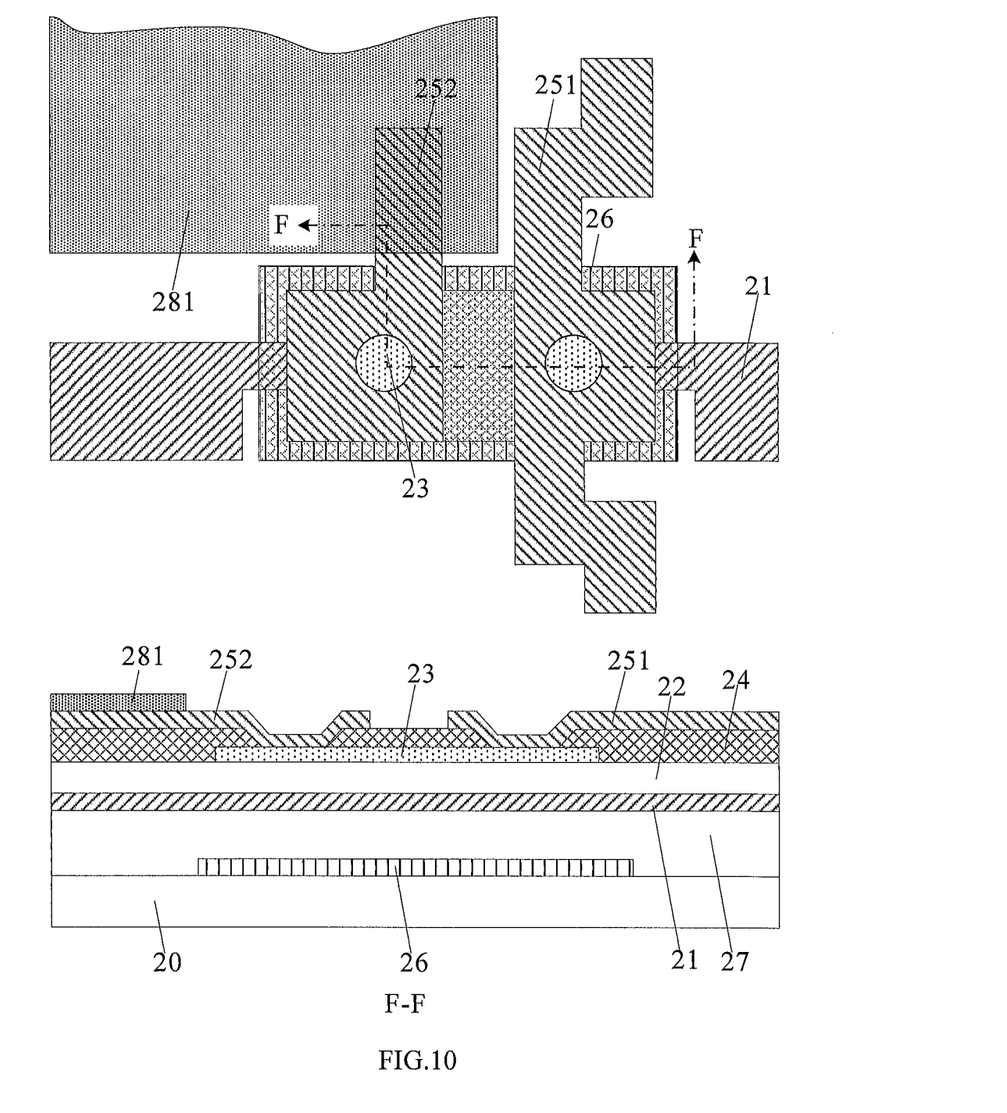
FIG. 10 is a partial top view and a sectional view in F-F direction of the substrate after forming the first transparent electrode according to an embodiment of the present invention.

The configuration of the substrate having the first transparent electrodes 281 formed thereon is illustrated in FIG. 10.

S409, a passivation layer is formed on a surface of the first transparent electrode by a patterning process, the passivation layer overlays the TFT.

S410, a second transparent electrode is formed on a surface of the passivation layer by a patterning process to form the array substrate as illustrated in FIG. 2.

As illustrated in FIG. 9, an overlapping area between the gate 21 and the source 251 is defined as a, and an overlapping area between the gate 21 and the drain 252 is defined as b, then $Cgs+Cgd=(a+b)/d1$, where d1 is the vertical distance between the gate 21 and the source 251 or the drain 252. An overlapping area between the shielding electrode 26 and the source 251 is defined as c, an overlapping area between the shielding electrode 26 and the drain 252 is d, and a vertical distance between the shielding electrode 26 and the source 251 or the drain 252 is d2. Now, two capacitances are formed by the shielding electrode 26: on one hand, a capacitance C1 is generated between the gate 21 and a part of the shielding electrode 26 which overlaps the gate 21, the capacitance C1 is connected in series with Cgs+Cgd such that a total series capacitance Ct1 is less than Cgs+Cgd; on the other hand, a capacitance C2 is generated between the source 251 (as well as the drain 252) and the part of the shielding electrode 26 which does not overlap the gate 21, then $C2=(c+d-a-b)/d2$. Since capacitances Ct1 and C2 are connected in parallel and $Ct1<Cgs+Cgd=(a+b)/d1$ (d1<d2), thus, $Ct1+C2<(a+b)/d1+(c+d-a-b)/d2<(c+d)/d1$. Whereas in the known array substrates, $Cgs+Cgd=(c+d)/d1$. The above analysis further demonstrates that the array substrate of the present disclosure can reduce the parasitic capacitance.

It is to be noted that in embodiments of the present invention, a FFS type display device is described as an example. The first transparent electrode 281 is a pixel electrode, the second transparent electrode 282 is a common electrode, and the first transparent electrode 281 is a plate-shaped electrode, and the second transparent electrode 282 is a strip-shaped electrode which comprises a plurality of metal strips spaced apart from one another.

The array substrate with such a configuration provided in the present embodiment can be also applied to various display devices such as an ADS type display device, an IPS type display device or a TN type display device. Specific locations and shapes of the common electrode and the pixel electrode may refer to the above description of embodiments. It can be contemplated that array substrates with different configurations may be also obtained by changing steps or processes for forming pixel electrode or common electrode in case the locations or shapes of the pixel electrode or the common electrode vary depending on different types of display devices, which will not be elaborated in the present disclosure.

With the above-mentioned manufacturing method of an array substrate, the capacitance formed between the shielding electrode and the gate of TFT shields the capacitance formed between the source and the gate of TFT in same area to a great extent, and the overlapping areas between the gate and source/drain of TFT can be reduced accordingly. Due to the reduced overlapping area between two electrodes of a parallel plate capacitor, capacitance is reduced significantly, which can effectively reduce the parasitic capacitance Cgs generated between the source and the gate of TFT and/or reduce the parasitic capacitance Cgd generated between the drain and the gate of TFT. Therefore, it is possible to avoid the step voltage output caused by too large parasitic capacitance, effectively reduce the blinking of displayed images and enhance the quality of display devices.

The present application is based on and claims priority of China patent application No. 201310740170.9 filed on Dec. 26, 2013, which is incorporated herein in its entirety by reference.

What are described above is related to the illustrative embodiments of the disclosure only and not limitative to the scope of the disclosure; the scopes of the disclosure are defined by the accompanying claims.

The invention claimed is:

1. An array substrate, comprising:
   a gate of a TFT and a gate insulating layer formed on a surface of a base substrate, and the gate being formed between the substrate and the gate insulating layer;
   a semiconductor active layer, an etching stop layer, a source and a drain of the TFT sequentially formed on a surface of the gate insulating layer that corresponds to the gate of the TFT, the source and the drain contacting the semiconductor active layer through vias respectively;
   the array substrate further comprising:
   a shielding electrode formed between the gate of the TFT and the base substrate; and
   an insulating layer formed between the gate of the TFT and the shielding electrode;
   wherein an overlapping area of vertical projections of the gate and the source on the array substrate is smaller than an overlapping area of vertical projections of the shielding electrode and the source on the array substrate; and/or an overlapping area of vertical projections of the gate and the drain on the array substrate is smaller than an overlapping area of vertical projections of the shielding electrode and the drain on the array substrate, and wherein the shielding electrode is made of conductive material and a capacitance is generated between the gate and the shielding electrode and a length of the shielding electrode in a direction in which the source is opposite to the drain is shorter than a length of the gate in the direction in which the source is opposite to the drain.

2. The array substrate of claim 1, further comprising:
   a first transparent electrode formed on a surface of the etching stop layer, the first transparent electrode contacting the drain of the TFT;

a passivation layer formed on a surface of the first transparent electrode, the passivation layer overlaying the TFT; and a second transparent electrode formed on a surface of the passivation layer.

3. The array substrate of claim 2, wherein a length of the shielding electrode is smaller than a length of the gate of the TFT.

4. The array substrate of claim 2, wherein the first transparent electrode is a pixel electrode having a plate shape, and the second transparent electrode is a common electrode having a strip shape;

the first transparent electrode is a plate-shaped electrode, and the second transparent electrode is a strip-shaped electrode.

5. The array substrate of claim 4, wherein a length of the shielding electrode is smaller than a length of the gate of the TFT.

6. The array substrate of claim 1, wherein the insulating layer is made of an organic resin material.

7. The array substrate of claim 1, wherein the semiconductor active layer is made of a transparent metal oxide material with semiconductor characteristic.

8. The array substrate of claim 1, wherein a length of the shielding electrode is smaller than a length of the gate of the TFT.

9. A display device, comprising an array substrate of claim 1 and a color filter substrate.

10. The display device of claim 9, wherein the array substrate further comprising:

a first transparent electrode formed on a surface of the etching stop layer, the first transparent electrode contacting the drain of the TFT;

a passivation layer formed on a surface of the first transparent electrode, the passivation layer overlaying the TFT; and a second transparent electrode formed on a surface of the passivation layer.

11. The display device of claim 10, wherein the first transparent electrode is a pixel electrode having a plate shape, and the second transparent electrode is a common electrode having a strip shape;

the first transparent electrode is a plate-shaped electrode, and the second transparent electrode is a strip-shaped electrode.

12. The display device of claim 10, wherein the insulating layer is made of an organic resin material.

13. The display device of claim 10, wherein the semiconductor active layer is made of a transparent metal oxide material with semiconductor characteristic.

14. The display device of claim 10, wherein a length of the shielding electrode is smaller than a length of the gate of the TFT.

15. A method of manufacturing an array substrate, comprising:

forming a shielding electrode on a surface of a base substrate;

forming an insulating layer on the surface of the substrate having the shielding electrode formed thereon;

forming a gate of TFT on a surface of the insulating layer at a location corresponding to the shielding electrode, wherein an overlapping area of vertical projections of the gate and the source on the array substrate is smaller than an overlapping area of vertical projections of the shielding electrode and the source on the array substrate; and/or an overlapping area of vertical projections of the gate and the drain on the array substrate is smaller than an overlapping area of vertical projections of the shielding electrode and the drain on the array substrate, wherein the shielding electrode is made of conductive material and a capacitance is generated between the gate and the shielding electrode and a length of the shielding electrode in a direction in which the source is opposite to the drain is shorter than a length of the gate in the direction in which the source is opposite to the drain.

16. The method of manufacturing an array substrate of claim 15, further comprising:

forming a gate insulating layer on the surface of the substrate having the gate of the TFT formed thereon;

forming a semiconductor active layer on a surface of the gate insulating layer that corresponds to the gate of the TFT;

forming an etching stop layer with vias on a surface of the semiconductor active layer;

forming the source and the drain of the TFT on a surface of the etching stop layer, the source and the drain of the TFT contacting the semiconductor active layer through vias respectively;

forming a first transparent electrode on a surface of the substrate having the source and the drain of the TFT formed thereon, the first transparent electrode contacting the drain of the TFT;

forming a passivation layer on a surface of the first transparent electrode, the passivation layer overlaying the TFT; and forming a second transparent electrode on a surface of the passivation layer.

17. The method of manufacturing an array substrate of claim 16, wherein the first transparent electrode is a pixel electrode, and the second transparent electrode is a common electrode;

the first transparent electrode is a plate-shaped electrode, and the second transparent electrode is a strip-shaped electrode.

18. The method of manufacturing an array substrate of claim 15, wherein the insulating layer is made of an organic resin material.

19. The method of manufacturing an array substrate of claim 15, wherein the semiconductor active layer is made of a transparent metal oxide material with semiconductor characteristic.

20. The method of manufacturing an array substrate of claim 15, wherein a length of the shielding electrode is smaller than a length of the gate of the TFT.

* * * * *